United States Patent
Hsu et al.

(10) Patent No.: US 7,029,924 B2
(45) Date of Patent: Apr. 18, 2006

(54) BUFFERED-LAYER MEMORY CELL

(75) Inventors: Sheng Teng Hsu, Camas, WA (US);
Tingkai Li, Vancouver, WA (US);
Fengyan Zhang, Vancouver, WA (US);
Wei Pan, Vancouver, WA (US);
Wei-Wei Zhuang, Vancouver, WA (US); David R. Evans, Beaverton, OR (US); Masayuki Tajiri, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/755,654

(22) Filed: Jan. 12, 2004

(65) Prior Publication Data

US 2005/0054119 A1    Mar. 10, 2005

Related U.S. Application Data

(63) Continuation-in-part of application No. 10/655,700, filed on Sep. 5, 2003.

(51) Int. Cl.
*H01L 21/00* (2006.01)
(52) U.S. Cl. ......................................................... 438/3
(58) Field of Classification Search ................ 257/261, 257/288, E27.006, 364, 245, 154; 438/3, 438/2
See application file for complete search history.

(56) References Cited

U.S. PATENT DOCUMENTS

| | | | | |
|---|---|---|---|---|
| 6,410,345 B1 * | 6/2002 | Moon et al. | ..................... | 438/3 |
| 6,753,561 B1 * | 6/2004 | Rinerson et al. | ............. | 257/295 |
| 6,815,784 B1 * | 11/2004 | Park et al. | .................. | 257/421 |
| 2004/0160804 A1 * | 8/2004 | Rinerson et al. | ............ | 365/158 |
| 2004/0202031 A1 * | 10/2004 | Kajiyama et al. | ........... | 365/200 |
| 2004/0235309 A1 * | 11/2004 | Hsu | ........................... | 438/706 |
| 2004/0256697 A1 * | 12/2004 | Jang | ........................... | 257/578 |

* cited by examiner

*Primary Examiner*—W. David Coleman
(74) *Attorney, Agent, or Firm*—Law Office of Gerald Maliszewski; Gerald Maliszewski

(57) ABSTRACT

A method is provided for forming a buffered-layer memory cell. The method comprises: forming a bottom electrode; forming a colossal magnetoresistance (CMR) memory film overlying the bottom electrode; forming a memory-stable semiconductor buffer layer, typically a metal oxide, overlying the memory film; and, forming a top electrode overlying the semiconductor buffer layer. In some aspects of the method the semiconductor buffer layer is formed from $YBa_2Cu_3O_{7-x}$ (YBCO), indium oxide ($In_2O_3$), or ruthenium oxide ($RuO_2$), having a thickness in the range of 10 to 200 nanometers (nm). The top and bottom electrodes may be TiN/Ti, Pt/TiN/Ti, In/TiN/Ti, PtRhOx compounds, or PtIrOx compounds. The CMR memory film may be a $Pr_{1-x}Ca_xMnO_3$ (PCMO) memory film, where x is in the region between 0.1 and 0.6, with a thickness in the range of 10 to 200 nm.

12 Claims, 3 Drawing Sheets

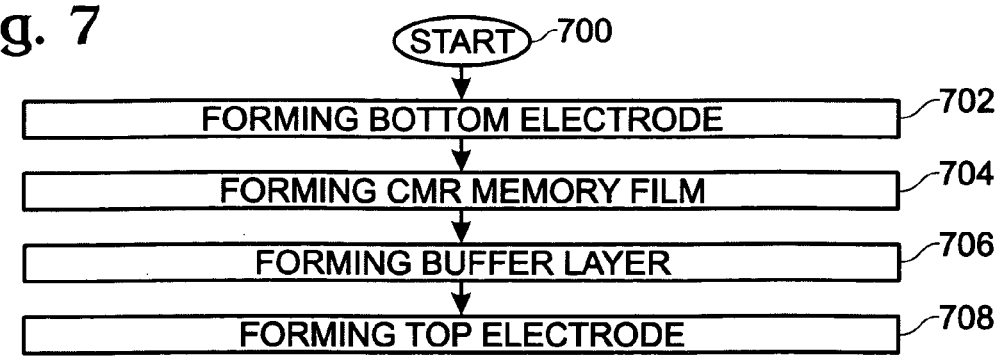
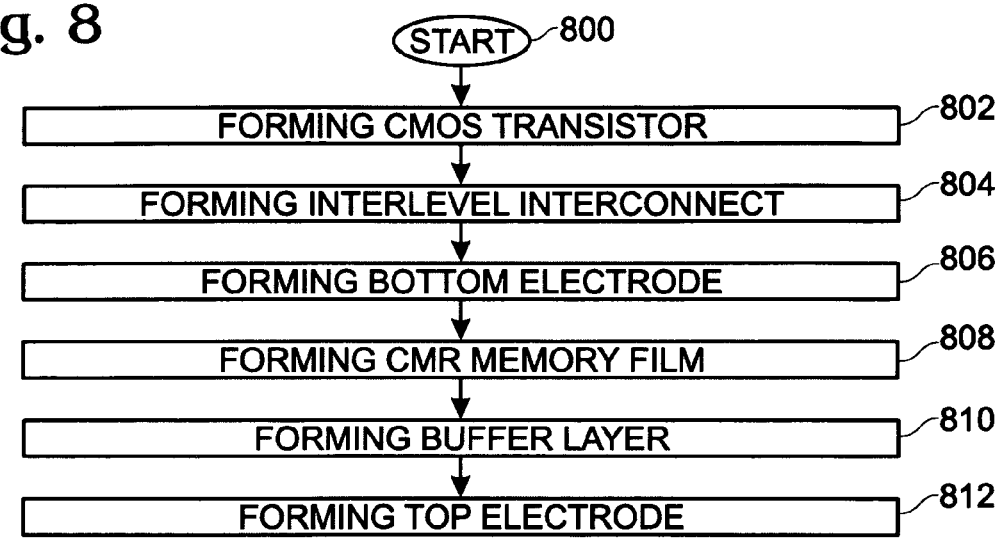
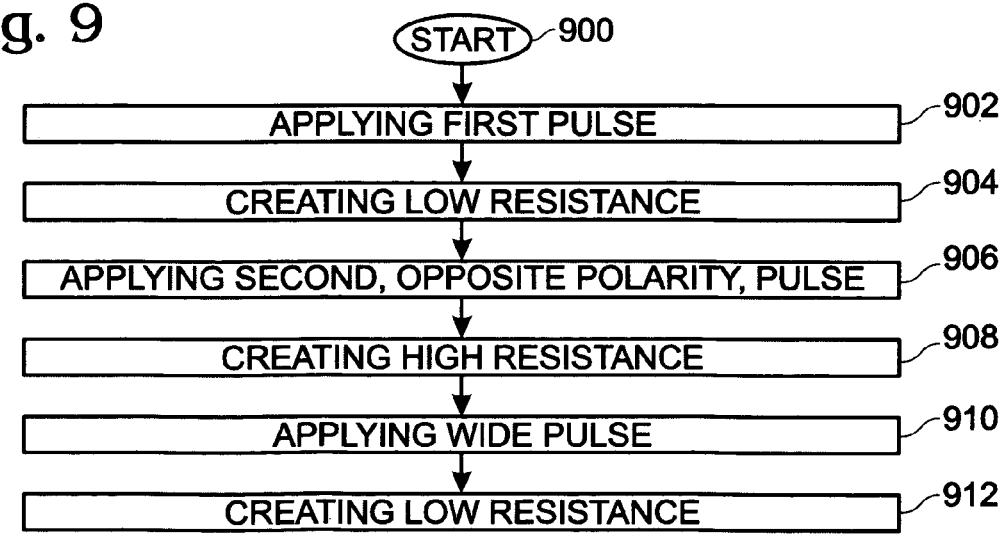

BUFFERED-LAYER MEMORY CELL

RELATED APPLICATIONS

This application is a continuation-in-part of a pending patent application entitled, ASYMMETRIC-AREA MEMORY CELL, invented by Hsu et al., Ser. No. 10/655,700, filed Sep. 5, 2003, attorney docket no. SLA819.

BACKGROUND OF THE INVENTION

1. Field of the Invention

This invention generally relates to a thin film resistance memory device, for non-volatile memory arrays, and more particularly, to a bipolar programmable memory cell having a buffer layer adjacent an electrode.

2. Description of the Related Art

State of the art resistor random access memories (RRAMs) are often made from a colossal magnetoresistance (CMR) memory film and, more typically, from a $Pr_{0.7}Ca_{0.3}MnO_3$ (PCMO) type of CMR material. The CMR material can be said to have a non-volatile nature, as the resistance of the CMR material remains constant under most circumstances. However, when a high electric field induces current flow through the CMR material, a change in the CMR resistance can result. During narrow-pulse programming, the resistivity of the memory resistor near an electrode changes. Experimental data shows that the resistivity of the CMR material near the cathode increases while that at the anode decreases. During the erase process the pulse polarity is reversed. That is, the designation of cathode and anode are reversed. Then, the FIG. 1 is a diagram of a symmetrical CMR film memory cell (prior art). The device is called symmetric because it has a uniform area along any cross-section of the CMR film thickness. The memory cell can be written to high-resistance state using either positive or negative narrow pulse, and reset to low-resistance state using a long-width electrical pulse. Other memory cells (not shown) may be written to high-resistance state and erased to low-resistance state using a narrow negative pulse and a narrow positive pulse, respectively. A memory device that is responsive to only one type of programming, either bipolar or uni-polar, has a necessarily limited usefulness, and is dependent upon system specifications and available power supplies.

Thus, some systems are designed for bipolar programming, whereas others are designed for uni-polar programming, depending upon the type of CMR memory cell being used. This uncertainty in the design of the memory cells necessarily increases production costs. Some CMR film memory cell designs are made bipolar programmable by manipulating the composition of the film along the thickness of the RRAM resistor. As the memory cell size is reduced, the thickness of the memory resistor thin film is also reduced. However, the CMR film composition can be a difficult variable to control.

It would be advantageous if a CMR memory cell could be programmed using bipolar, as well as uni-polar pulses.

It would be advantageous if a process for fabricating a CMR memory cell, responsive to either bipolar or uni-polar programming, could be made scalable for processes using increasing smaller feature sizes.

SUMMARY OF THE INVENTION

The present invention provides a CMR memory device structure that can be reliably programmed using a bipolar pulse programming process. Alternately, the device can be programmed using a uni-polar pulse programming process. The flexibility in programming is a result of the device's unique buffered-layer design.

Accordingly, a method is provided for forming a buffered-layer memory cell. The method comprises: forming a bottom electrode; forming a colossal magnetoresistance (CMR) memory film overlying the bottom electrode; forming a memory-stable semiconductor buffer layer, typically a metal oxide, overlying the memory film; and, forming a top electrode overlying the semiconductor buffer layer.

In some aspects of the method, the semiconductor buffer layer is formed from $YBa_2Cu_3O_{7-X}$ (YBCO), indium oxide ($In_2O_3$), or ruthenium oxide ($RuO_2$), having a thickness in the range of 10 to 200 nanometers (nm). The top and bottom electrodes may be TiN/Ti, Pt/TiN/Ti, In/TiN/Ti, PtRhOx compounds, or PtIrOx compounds. The CMR memory film may be a $Pr_{1-X}Ca_XMnO_3$ (PCMO) memory film, where x is in the region between 0.1 and 0.6, with a thickness in the range of 10 to 200 nm. However, other memory resistor materials are known.

Additional details of the above-described method, a method for programming a buffered-layer memory cell using either bipolar or uni-polar pulses, a buffered-layer memory cell device, and a buffered-layer RRAM are provided below.

BRIEF DESCRIPTION OF THE DRAWINGS

FIG. 7 is a flowchart illustrating the present invention method for forming a buffered-layer memory cell.

FIG. 8 is a flowchart illustrating the present invention method for forming an RRAM buffered-layer memory cell.

FIG. 9 is a flowchart illustrating the present invention method for programming a buffered-layer memory cell using bipolar and uni-polar pulses.

DETAILED DESCRIPTION OF THE PREFERRED EMBODIMENTS

Figure 1:
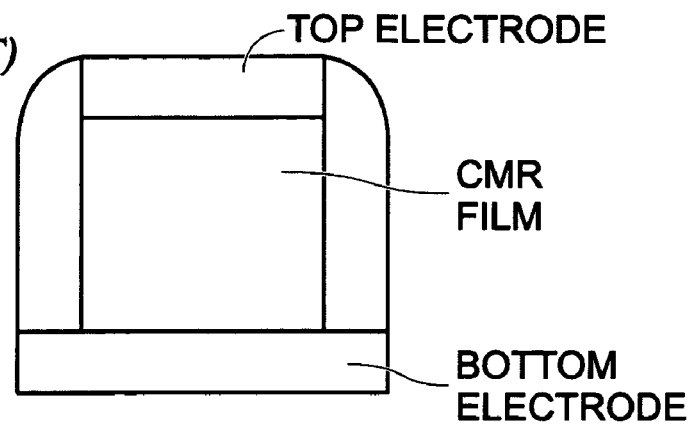
FIG. 1 is a diagram of a symmetrical CMR film memory cell (prior art).
Figure 2:
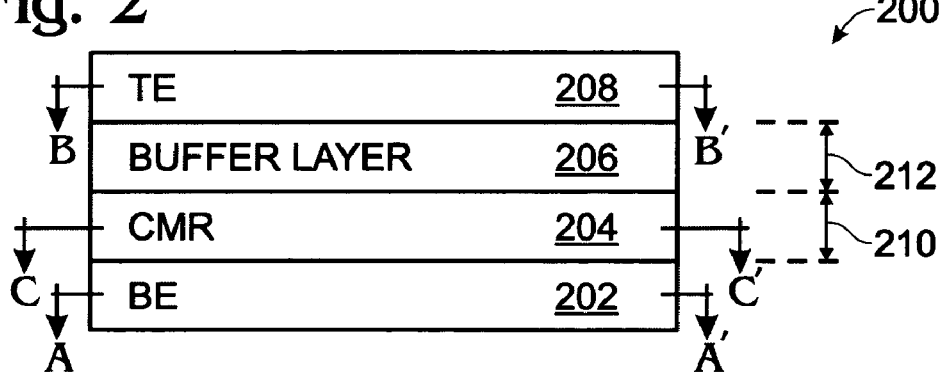
FIG. 2 is a partial cross-sectional view of the present invention buffered-layer memory cell.

FIG. 2 is a partial cross-sectional view of the present invention buffered-layer memory cell. The memory cell 200 comprises a bottom electrode (BE) 202 and a CMR memory film 204 overlying the bottom electrode 202. A memory-stable semiconductor buffer layer 206 overlies the CMR memory film 204 and a top electrode (TE) 208 overlies the semiconductor buffer layer 206. Although the buffer layer 206 is shown adjacent the top electrode 208, in other aspects (see FIG. 6), the buffered layer 206 is adjacent the bottom electrode 202 and the CMR memory film 204 is adjacent the top electrode 208.

Figure 3:
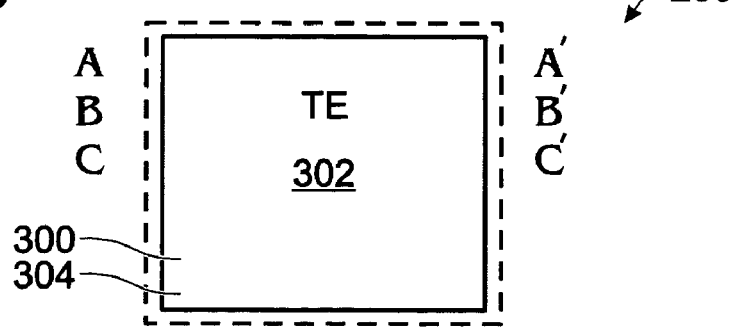
FIG. 3 is a plan view of the memory device of FIG. 2.

FIG. 3 is a plan view of the memory device 200 of FIG. 2. Considering both FIGS. 2 and 3, the top electrode 208 and bottom electrode 202 need not be asymmetric for the memory device 200 to be bipolar programmable. The programming aspects of the invention are discussed in more detail below. Alternately stated, the bottom electrode 202 has an area 300 (marked in phantom with dotted lines), where an area is understood to be surface area of the cross-section AA'. The top electrode 208 has an area 302 (BB') approximately equal to the bottom electrode area 300. As used herein, the word "approximately" means within conventional IC fabrication process tolerances. Symmetric devices are typically easier to fabricate, however, in another aspect (not shown), the memory cell 200 may include asymmetric-area electrodes, along with a buffered-layer. Likewise, the CMR film 204 may have an area 304 (CC') approximately equal to the bottom electrode area 300.

Returning to FIG. 2, the semiconductor buffer layer 204 is typically formed from a metal oxide material, such as $YBa_2Cu_3O_{7-X}$ (YBCO), indium oxide ($In_2O_3$), or ruthenium oxide ($RuO_2$). However, other semiconductor materials without memory properties, especially other metal oxides, may possibly be used.

The CMR memory film 204 has a thickness 210 in the range of 10 to 200 nanometers (nm). The semiconductor buffer layer 206 has a thickness 212 in the range of 10 to 200 nm. The CMR memory film 204 is formed from $Pr_{1-X}Ca_XMnO_3$ (PCMO), where x is in the region between 0.1 and 0.6. However, other materials are also known in the art such as high temperature super conducting (HTSC), and perovskite metal oxide materials.

The bottom electrode 202 is formed from a material selected from the group such as TiN/Ti, Pt/TiN/Ti, In/TiN/Ti, PtRhOx compounds, or PtIrOx compounds. Likewise, the top electrode 208 is formed from a material selected from the group including TiN, TiN/Pt, TiN/In, PtRhOx compounds, or PtIrOx compounds.

Figure 4:
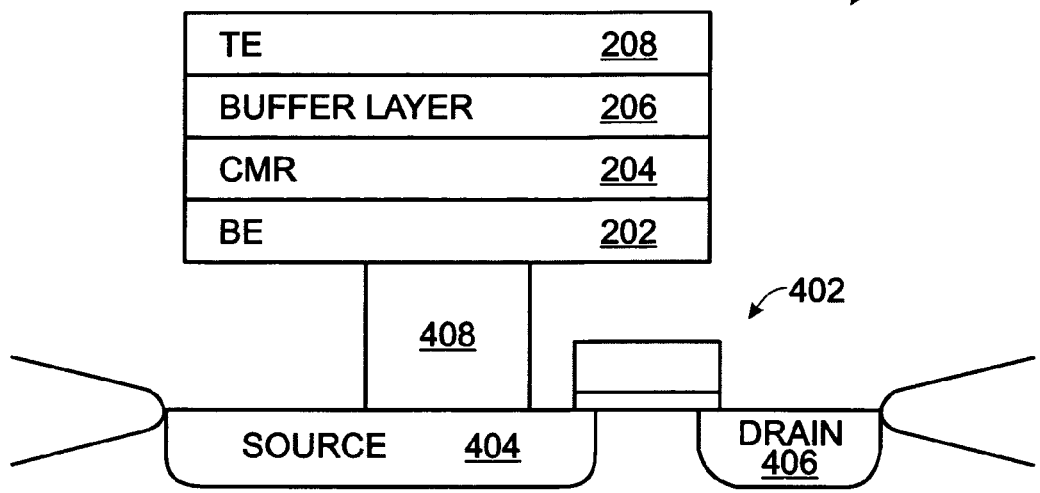
FIG. 4 is a partial cross-sectional view of the present invention RRAM buffered-layer memory cell.

FIG. 4 is a partial cross-sectional view of the present invention RRAM buffered-layer memory cell. The RRAM memory cell 400 comprises a CMOS transistor 402 with source 404 and drain 406 active regions. A metal interlevel interconnect 408 overlies one of the transistor active regions. As shown, the interconnect 408 overlies the source 404. However, in other aspects (not shown), the interconnect 408 may overlie the drain 406. A bottom electrode 202 overlies the interlevel interconnect 408. A CMR memory film 204 overlies the bottom electrode 202. A memory-stable semiconductor buffer layer 206 overlies the CMR memory film 204 and a top electrode 208 overlies the semiconductor buffer layer 206. Again, it should be understood that the semiconductor buffer layer may alternately be located adjacent the bottom electrode 202 instead of the top electrode 208. Details of the memory cell 202/204/206/208 have been explained above in the description of FIGS. 2 and 3 and will not be repeated here in the interest of brevity.

Functional Description

The pending patent application entitled, "ASYMMETRIC-AREA MEMORY CELL", mentioned above in the Related Applications Section, which is incorporated herein by reference, describes a method for fabricating bipolarity switchable resistance memory resistors. This structure varies the cross-sectional area of memory material, along the vertical dimension of the resistor. When the thickness of the memory resistor is very thin, small sized asymmetric-area memory cells can be a challenge to fabricate. The present invention buffered-layer memory cell, however, forms a structure with uniform material cross-sectional areas (as defined above). Therefore, the memory resistor fabrication process is simple and easily scaled to very small sizes.

It is well understood that a change in resistance occurs only near the electrode. When the resistivity of the memory resistor material near the cathode increases, the resistance of the resistor material near the anode typically decreases. The high and low-state resistance values are dependent upon the precise thickness of the memory resist material. However, the memory resistor thickness is not a critical factor in making the devices switchable. The thickness of the memory resistor may be very thin. When a non-memory semiconductive buffer layer is added onto the memory resistor, a non-symmetric memory resistor can be obtained without tailoring the cross-sectional area, or the composition of the memory resistor material.

Figure 5:
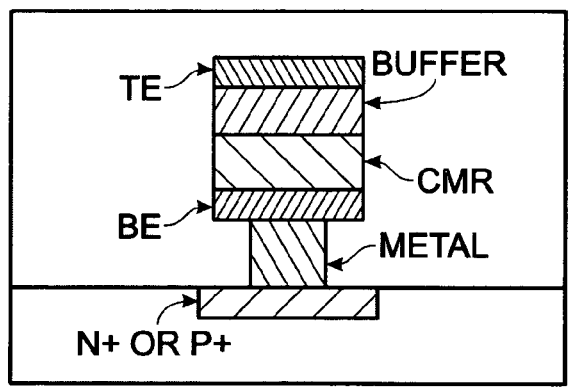
FIG. 5 is a partial cross-sectional view of a buffered-layer memory cell.

FIG. 5 is a partial cross-sectional view of a buffered-layer memory cell. Although the memory resistor in this figure is marked as CMR, any other material, whose resistance is responsive to an electrical pulse, may be used in this structure. The thickness of the memory resistor material and that of the semiconductor metal oxide buffer layer can be from 10 nm to 200 nm. The non-memory semiconductive buffer layer can be a metal oxide such as YBCO, $In_2O_3$, or $RuO_2$. These particular materials are mentioned because they do not intake additional oxygen when heated in an oxygen ambient environment.

The upper portion of the memory resistor is made of semiconductive metal oxide, and has no memory properties. Resistance change, as a result of programming, occurs only in the lower portion of the memory resistor. As a result, this memory resistor can be programmed using either bipolar or uni-polar pulses. A narrow positive pulse applied to the top electrode increases the resistance of the resistor. A narrow negative pulse applied to the top electrode decreases the resistance of the resistor. The resistance may also be reduced by applying a wide width pulse, either positive or negative, to the top electrode (TE). The oxygen content of the upper layer semiconductive metal oxide does not change. Therefore, the oxygen content in the memory resistor remains constant after any heat treatment, and can sustain operation-induced heat without degradation of the memory properties, if the memory resistor is protected with a oxygen diffusion barrier material, between itself and the adjacent electrode.

Figure 6:
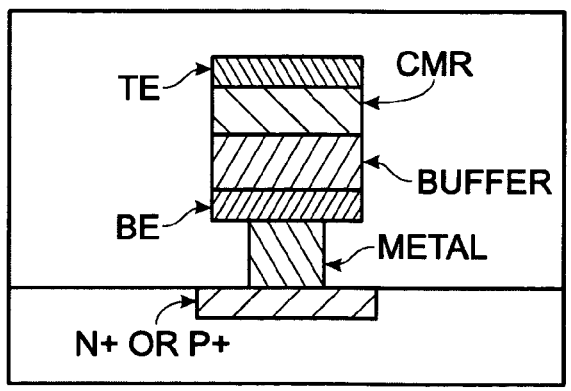
FIG. 6 is a partial cross-sectional view featuring an alternate aspect of the present invention memory cell.

FIG. 6 is a partial cross-sectional view featuring an alternate aspect of the present invention memory cell. Although the buffered semiconductive metal oxide layer is shown between the memory resistor and the top electrode in FIGS. 2 and 5, it may also be placed between the bottom electrode and the memory resistor, as seen in FIG. 6. In this case the above-mentioned programming pulse polarities are reversed.

FIG. 7 is a flowchart illustrating the present invention method for forming a buffered-layer memory cell. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 700.

Step 702 forms a bottom electrode. Step 704 forms a colossal magnetoresistance (CMR) memory film overlying the bottom electrode. Step 706 forms a memory-stable semiconductor buffer layer overlying the memory film, typically of a metal oxide material. Other non-memory property semiconductor materials may also be used in place of a semiconductor metal oxide. Step 708 forms a top electrode overlying the semiconductor buffer layer.

In some aspects of the method, Step 706 forms the semiconductor buffer layer from a material such as YBa$_2$Cu$_3$O$_{7-X}$ (YBCO), indium oxide (In$_2$O$_3$), or ruthenium oxide (RuO$_2$), having a thickness in the range of 10 to 200 nm.

In other aspects, forming a bottom electrode in Step 702 includes forming an electrode from a material selected from the group including TiN/Ti, Pt/TiN/Ti, In/TiN/Ti, PtRhOx compounds, or PtIrOx compounds. Likewise, Step 708 forms a top electrode from a material selected from the group including TiN, TiN/Pt, TiN/In, PtRhOx compounds, and PtIrOx compounds.

In one aspect, forming a CMR memory film overlying the bottom electrode in Step 704 includes forming a Pr$_{1-X}$Ca$_X$MnO$_3$ (PCMO) memory film, where x is in the region between 0.1 and 0.6, with a thickness in the range of 10 to 200 nm. However, other memory resistor materials are well known in the art.

In another aspect, forming a bottom electrode in Step 702 includes forming a bottom electrode with an area, and forming a top electrode in Step 708 includes forming a top electrode with an area approximately equal to the bottom electrode area. Likewise, forming a CMR film in Step 704 may include forming a CMR film with an area approximately equal to the bottom electrode area. Alternately stated, the memory cell has a symmetrical structure.

FIG. 8 is a flowchart illustrating the present invention method for forming an RRAM buffered-layer memory cell. The method starts at Step 800. Step 802 forms a CMOS transistor with source and drain active regions. Step 804 forms a metal interlevel interconnect to a transistor active region (either the source or drain). Step 806 forms a bottom electrode overlying the interlevel interconnect. Step 808 forms a CMR memory film overlying the bottom electrode. Step 810 forms a memory-stable semiconductor buffer layer overlying the memory film. Step 812 forms a top electrode overlying the semiconductor buffer layer.

FIG. 9 is a flowchart illustrating the present invention method for programming a buffered-layer memory cell using bipolar and uni-polar pulses. The method starts at Step 900. Step 902 applies a first voltage pulse with a first polarity to a memory cell top electrode. Step 904, in response to the first pulse, creates a low resistance in a CMR memory film, buffered from the top electrode by a memory-stable semiconductor region. Step 906 applies a second voltage pulse with a second polarity, opposite of the first polarity, to the memory cell top electrode. Step 908, in response to the second pulse, creates a high resistance in the CMR memory film. Step 910 applies a third pulse, having a polarity selected from the group including the first and second polarities, and a pulse width of greater than 5 microseconds. Step 912, in response to the third pulse, creates a low resistance in the CMR memory film.

In some aspects, creating a low resistance in the CMR memory film in response to the first pulse (Step 904 and/or Step 912) includes creating a resistance in the range of 1000 to 10k ohms. Creating a high resistance in the CMR memory film in response to the second pulse (Step 908) includes creating a resistance in the range of 100k to 10M ohms. These resistances are, at least partially, dependent upon the thickness of the CMR film. Other resistance ranges may be obtained by changing the CMR film thickness, or by using different memory resistor materials.

In another aspect, applying a first pulse with a first polarity to the memory cell top electrode (Step 902) includes applying a voltage pulse with a width in the range of 5 to 500 nanoseconds (ns). Likewise, applying a second pulse with a second polarity to the memory cell top electrode (Step 906) includes applying a voltage pulse with a width in the range of 5 to 500 ns.

In a different aspect, where the CMR film has a thickness in the range of 10 to 200 nanometers, Step 902 applies a pulse with a voltage amplitude in the range of 2 to 6 volts. Likewise, applying a second pulse with a second polarity to the memory cell top electrode (Step 906) includes applying a pulse with a voltage amplitude in the range of 2 to 6 volts.

The above-mentioned programming voltages are referenced to a memory cell structure where the buffered-layer is adjacent the top electrode, and the programming pulses are applied to the top electrode. The programming pulse voltages are revered if either the buffered-area is placed adjacent to the bottom electrode, or the programming voltages are applied to the bottom electrode.

A buffered-layer memory cell, a corresponding RRAM structure, programming procedure, and fabrication process have been presented. Specific details, such as widths, thicknesses, and materials have been used to illustrate the invention. However, the invention is not limited to merely these examples. Other variations and embodiments of the invention will occur to those skilled in the art.

We claim:

1. A method for forming a buffered-layer memory cell, the method comprising:
   forming a bottom electrode;
   forming a colossal magnetoresistance (CMR) memory film overlying the bottom electrode;
   forming a YBa$_2$Cu$_3$O$_{7-X}$ (YBCO) buffer layer overlying the memory film; and,
   forming a top electrode overlying the YBCO layer.

2. The method of claim 1 wherein forming a bottom electrode includes forming an electrode from a material selected from the group including TiN/Ti, Pt/TiN/Ti, In/TiN/Ti, PtRhOx compounds, and PtIrOx compounds; and,
   wherein forming a top electrode includes forming an electrode from a material selected from the group including TiN, TiN/Pt, TiN/In, PtRhOx compounds, and PtIrOx compounds.

3. The method of claim 1 wherein forming a CMR memory film overlying the bottom electrode includes forming a Pr$_{1-X}$Ca$_X$MnO$_3$ (PCMO) memory film, where x is in the region between 0.1 and 0.6.

4. The method of claim 1 wherein forming the CMR memory film includes forming a CMR memory film with a thickness in the range of 10 to 200 nm.

5. A method for forming a buffered-layer memory cell, the method comprising:
   forming a bottom electrode;
   forming a colossal magnetoresistance (CMR) memory film overlying the bottom electrode;
   forming a indium oxide (In$_2$O$_3$) buffer layer overlying the memory film; and,
   forming a top electrode overlying the In$_2$O$_3$ layer.

6. The method of claim 5 wherein forming a bottom electrode includes forming an electrode from a material selected from the group including TiN/Ti, Pt/TiN/Ti, In/TiN/Ti, PtRhOx compounds, and PtIrOx compounds; and,
   wherein forming a top electrode includes forming an electrode from a material selected from the group including TiN, TiN/Pt, TiN/In, PtRhOx compounds, and PtIrOx compounds.

7. The method of claim 5 wherein forming a CMR memory film overlying the bottom electrode includes forming a $Pr_{1-x}Ca_xMnO_3$ (PCMO) memory film, where x is in the region between 0.1 and 0.6.

8. The method of claim 5 wherein forming the CMR memory film includes forming a CMR memory film with a thickness in the range of 10 to 200 nm.

9. A method for forming a buffered-layer memory cell, the method comprising:
 forming a bottom electrode;
 forming a colossal magnetoresistance (CMR) memory film overlying the bottom electrode;
 forming a ruthenium oxide ($RuO_2$) buffer layer overlying the memory film; and,
 forming a top electrode overlying the $RuO_2$ layer.

10. The method of claim 9 wherein forming a bottom electrode includes forming an electrode from a material selected from the group including TiN/Ti, Pt/TiN/Ti, In/TiN/Ti, PtRhOx compounds, and PtIrOx compounds; and,
 wherein forming a top electrode includes forming an electrode from a material selected from the group including TiN, TiN/Pt, TiN/In, PtRhOx compounds, and PtIrOx compounds.

11. The method of claim 9 wherein forming a CMR memory film overlying the bottom electrode includes forming a $Pr_{1-x}Ca_xMnO_3$ (PCMO) memory film, where x is in the region between 0.1 and 0.6.

12. The method of claim 9 wherein forming the CMR memory film includes forming a CMR memory film with a thickness in the range of 10 to 200 nm.

* * * * *